(12) United States Patent
Wang et al.

(10) Patent No.: US 12,166,484 B2
(45) Date of Patent: Dec. 10, 2024

(54) ON-CHIP RC OSCILLATOR, CHIP, AND COMMUNICATION TERMINAL

(71) Applicant: VANCHIP (TIANJIN) TECHNOLOGY CO., LTD., Tianjin (CN)

(72) Inventors: Yongshou Wang, Tianjin (CN); Chenyang Gao, Tianjin (CN); Sheng Lin, Tianjin (CN)

(73) Assignee: VANCHIP (TIANJIN) TECHNOLOGY CO., LTD., Tianjin (CN)

(*) Notice: Subject to any disclaimer, the term of this patent is extended or adjusted under 35 U.S.C. 154(b) by 30 days.

(21) Appl. No.: 18/318,031

(22) Filed: May 16, 2023

(65) Prior Publication Data

US 2023/0283265 A1    Sep. 7, 2023

Related U.S. Application Data

(63) Continuation of application No. PCT/CN2021/130943, filed on Nov. 16, 2021.

(51) Int. Cl.
*H03K 3/0231*  (2006.01)
*H03B 5/24*    (2006.01)

(52) U.S. Cl.
CPC ............. *H03K 3/0231* (2013.01); *H03B 5/24* (2013.01)

(58) Field of Classification Search
CPC .......... H03K 3/0231; H03B 5/24; H03B 5/26; H03B 5/04; G05F 1/461; G05F 3/30
See application file for complete search history.

(56) References Cited

U.S. PATENT DOCUMENTS

| | | | |
|---|---|---|---|
| 2017/0353158 A1* | 12/2017 | Hsu | H03K 3/011 |
| 2021/0036660 A1* | 2/2021 | Hong | H03K 4/501 |
| 2021/0058031 A1* | 2/2021 | Zhang | H03B 5/24 |

* cited by examiner

*Primary Examiner* — Jeffrey M Shin
(74) *Attorney, Agent, or Firm* — George Guosheng Wang; Upstream Research and Patent LLC

(57) ABSTRACT

Disclosed are an on-chip RC oscillator, a chip, and a communication terminal. The on-chip RC oscillator comprises a stabilized voltage supply module, an RC core oscillator module, a frequency sampling and conversion module, and a frequency trimming module. By means of the frequency sampling and conversion module, the clock frequency of the oscillator is sampled and detected in real time, and the sampled clock frequency is converted into a voltage signal, and then analog-to-digital conversion is performed to obtain a corresponding digital code, so that when the clock frequency changes, the frequency trimming module circuit converts said digital code into a control signal; a voltage having a suitable temperature coefficient is outputted for the RC core oscillator module; also, a zero temperature coefficient current of a suitable magnitude is outputted for the RC core oscillator module, so as to precisely calibrate the clock frequency.

14 Claims, 4 Drawing Sheets

ON-CHIP RC OSCILLATOR, CHIP, AND COMMUNICATION TERMINAL

BACKGROUND

Technical Field

The present disclosure relates to an on-chip RC oscillator, and also relates to an integrated circuit chip including the on-chip RC oscillator and a corresponding communication terminal, belonging to the technical field of analog integrated circuits.

Related Art

With the continuous development of integrated circuit technologies and the continuous improvement of performances of integrated circuit systems, new challenges and opportunities have been put forward for high-precision integrated circuits. On-chip RC oscillators are widely used in integrated circuit chips, especially in mixed-signal chips and high-end analog chips. The integration of a high-precision on-chip RC oscillator into an integrated circuit chip cannot only improve the accuracy and reliability of a system, but also reduce the cost of the system. In a high-precision mixed-signal integrated circuit chip, the quality of a clock signal outputted by the on-chip RC oscillator affects the conversion accuracy of an analog-to-digital conversion circuit. At the same time, the integration of high-precision on-chip RC oscillators into other integrated circuit chips with communication interfaces can greatly reduce the bit error rates of the communication interfaces, and thus, the stability and reliability of data transmission of the communication interfaces are greatly improved.

A high-frequency low-temperature drift RC oscillator has been disclosed in the Chinese Patent Application with the application No. 201710598686.2. Although the frequency of the oscillator has been subjected to temperature trimming and accuracy calibration to a certain extent, the temperature characteristics of the output frequency of the oscillator have a large deviation with the change of temperature as a calibration current used for the oscillator has a certain temperature coefficient. In addition, as the temperature calibration of the oscillator is realized by an active device (such as NMOSFET) and a resistor, the resistance value of the resistor has obvious process dispersion and electrical parameter dependence, so that the accuracy of the output frequency of the oscillator is greatly limited.

In addition, a trimmable high-accuracy RC oscillator has been disclosed in the Chinese Patent Application with the application No. 201811430806.9. The principle of the oscillator to realize low-temperature drift is to introduce a part of the input offset voltage by adjusting the output impedance of an amplifier, and change the temperature coefficient of the oscillator by adjusting the absolute value of the comparator delay for compensating for the temperature characteristics of the digital logic delay time in the back stage. However, the accuracy of the output frequency of the oscillator is limited due to the certain temperature characteristics of a digital delay unit itself, and the higher the output frequency is, the greater the difficulty of implementation is.

SUMMARY

The primary technical problem to be solved by the present disclosure is to provide an on-chip RC oscillator.

Another technical problem to be solved by the present disclosure is to provide a chip including the on-chip RC oscillator and a corresponding communication terminal.

In order to achieve the above purpose, the present disclosure adopts the technical solutions as follows:

According to a first aspect of embodiments of the present disclosure, provided is an on-chip RC oscillator. The on-chip RC oscillator includes a stabilized voltage supply module, an RC core oscillator module, a frequency sampling and conversion module, and a frequency trimming module. The stabilized voltage supply module is respectively connected to the RC core oscillator module, the frequency sampling and conversion module, and the frequency trimming module. The output end of the RC core oscillator module is connected to the input end of the frequency sampling and conversion module. The output end of the frequency sampling and conversion module is connected to the input end of the frequency trimming module. The output end of the frequency trimming module is connected to the RC core oscillator module.

The stabilized voltage supply module is configured to generate a supply voltage that does not change with a source voltage.

The frequency sampling and conversion module is configured to convert the real-time sampled frequency of a clock signal outputted by the RC core oscillator module into a voltage signal, and then perform analog-to-digital conversion to obtain a corresponding digital code.

The frequency trimming module is configured to receive the digital code, and generate a control signal through the digital code according to a preset voltage with a standard temperature coefficient and current with a zero temperature coefficient of the on-chip RC oscillator for controlling the output of a voltage with an appropriate temperature coefficient and the current with the zero temperature coefficient to the RC core oscillator module, so as to realize temperature compensation and accuracy calibration of the frequency of a clock signal outputted by the RC core oscillator module.

Preferably, the RC core oscillator module includes a first switch transistor, a second switch transistor, a first capacitor, a first comparator, a second comparator, an RS trigger and a buffer circuit. Gate electrodes of the first switch transistor and the second switch transistor are respectively connected to the output end of the RS trigger. Drain electrodes of the first switch transistor and the second switch transistor are respectively connected to one end of a first bias current and one end of a second bias current. The other end of the first bias current and the other end of the second bias current are connected to one end of the first capacitor, the inverting input end of the first comparator and the non-inverting input end of the second comparator. The non-inverting input end of the first comparator and the inverting input end of the second comparator are connected to the corresponding voltage output end of the frequency trimming module. The output ends of the first comparator and the second comparator are connected to the corresponding input end of the RS trigger. The signal output end of the RS trigger is connected to the input end of the buffer circuit. The first comparator, the second comparator and the RS trigger respectively receive reset signals. A source electrode of the first switch transistor is connected to the source voltage. A source electrode of the second switch transistor and the other end of the first capacitor are respectively grounded.

Preferably, the frequency sampling and conversion module includes a frequency sampling module and an analog-to-digital conversion module. The input end of the frequency sampling module is connected to the output end of the RC core oscillator module. The output end of the frequency sampling module is connected to the input end of the analog-to-digital conversion module. The output end of the analog-to-digital conversion module is connected to the input end of the frequency trimming module.

Preferably, the frequency sampling module includes a two-phase non-overlapping clock generation circuit, a switched capacitor resistor and a voltage in-phase proportional amplifier. The input end of the two-phase non-overlapping clock generation circuit is connected to the output end of the RC core oscillator module. The output end of the two-phase non-overlapping clock generation circuit is connected to the switched capacitor resistor. The switched capacitor resistor is respectively connected to a zero-temperature current source and the input end of the voltage in-phase proportional amplifier. The output end of the voltage in-phase proportional amplifier is connected to the analog-to-digital conversion module.

Preferably, the switched capacitor resistor includes a first NMOS transistor, a second NMOS transistor and a second capacitor. Gate electrodes of the first NMOS transistor and the second NMOS transistor are respectively connected to the output end of the two-phase non-overlapping clock generation circuit. A source electrode of the first NMOS transistor is connected to the zero-temperature current source. A drain electrode of the first NMOS transistor and a source electrode of the second NMOS transistor are respectively connected to one end of the second capacitor. The other end of the second capacitor is grounded. A drain electrode of the second NMOS transistor is connected to the input end of the voltage in-phase proportional amplifier.

Preferably, the voltage in-phase proportional amplifier includes a first operational amplifier, a first resistor and a second resistor. The non-inverting input end of the first operational amplifier is connected to the drain electrode of the second NMOS transistor. The inverting input end of the first operational amplifier is connected to one end of the first resistor and one end of the second resistor. The other end of the first resistor is grounded. The other end of the second resistor is respectively connected to the output end of the first operational amplifier and the analog-to-digital conversion module.

Preferably, the frequency trimming module includes a decoding and logic control circuit, a clock temperature drift trimming circuit and a clock absolute accuracy trimming circuit. The input end of the decoding and logic control circuit is connected to the output end of the analog-to-digital conversion module. The output end of the decoding and logic control circuit is respectively connected to the input ends of the clock temperature drift trimming circuit and the clock absolute accuracy trimming circuit. The clock temperature drift trimming circuit is connected to the non-inverting input end of the first comparator and the inverting input end of the second comparator. The output end of the clock absolute accuracy trimming circuit is connected to the first bias current and the second bias current.

Preferably, the clock temperature drift trimming circuit includes a second band gap reference circuit, a first transmission gate switch group and a second low-dropout linear voltage regulator. The second band gap reference circuit is connected to the first transmission gate switch group. The first transmission gate switch group is respectively connected to the output end of the decoding and logic control circuit and the input end of the second low-dropout linear voltage regulator. The output end of the second low-dropout linear voltage regulator is correspondingly connected to the non-inverting input end of the first comparator and the inverting input end of the second comparator.

Preferably, the second band gap reference circuit generates voltages with different values and different temperature coefficients through a first resistor voltage-divider network composed of a plurality of fourth resistors connected in series, and each voltage is correspondingly connected to one transmission gate switch in the first transmission gate switch group.

Preferably, the second low-dropout linear voltage regulator includes an error amplifier, a power transistor, a second resistor voltage-divider network and a third resistor voltage-divider network. The non-inverting input end of the error amplifier is connected to the first transmission gate switch group. The inverting input end of the error amplifier is connected to one end of the second resistor voltage-divider network and one end of the third resistor voltage-divider network. The other end of the second resistor voltage-divider network is connected to a drain electrode of the power transistor. The output end of the error amplifier is connected to a grate electrode of the power transistor.

Preferably, the clock absolute accuracy trimming circuit includes a first programmable current source, a second programmable current source, a second transmission gate switch group and a third transmission gate switch group. The first programmable current source and the second programmable current source are correspondingly connected to the output end of the stabilized voltage supply module through a first current mirroring circuit and a second current mirroring circuit. The first programmable current source is connected to the second transmission gate switch group. The second programmable current source is connected to the third transmission gate switch group. The second transmission gate switch group and the third transmission gate switch group are respectively connected to the output end of the decoding and logic control circuit.

Preferably, the first programmable current source is composed of a plurality of third PMOS transistors. A gate electrode of each of the third PMOS transistors is respectively connected to the output end of a voltage-to-current circuit through the first current mirroring circuit. A drain electrode of each of the third PMOS transistors is respectively connected to a second transmission gate switch in the second transmission gate switch group.

The second programmable current source is composed of a plurality of third NMOS transistors. A gate electrode of each of the third NMOS transistors is respectively connected to the output end of the voltage-to-current circuit through the second current mirroring circuit. A drain electrode of each of the third NMOS transistors is respectively connected to a third transmission gate switch in the third transmission gate switch group.

According to a second aspect of the embodiments of the present disclosure, an integrated circuit chip is provided and includes the above-mentioned on-chip RC oscillator.

According to a third aspect of the embodiments of the present disclosure, a communication terminal is provided and includes the above-mentioned on-chip RC oscillator.

According to the on-chip RC oscillator, the chip and the communication terminal provided by the embodiments of the present disclosure, by means of the frequency sampling and conversion module, the clock frequency of the oscillator is sampled and detected in real time, and the sampled clock frequency is converted into a voltage signal, and then analog-to-digital conversion is performed to obtain a corresponding digital code, so that when the clock frequency changes, the frequency trimming module circuit converts the digital code into a control signal. On one hand, a voltage having a suitable temperature coefficient is outputted for the RC core oscillator module, so as to achieve temperature compensation of the clock frequency; and on the other hand, a zero temperature coefficient current of a suitable magnitude is outputted for the RC core oscillator module, so as to calibrate the accuracy of the clock frequency.

DETAILED DESCRIPTION

Figure 1:
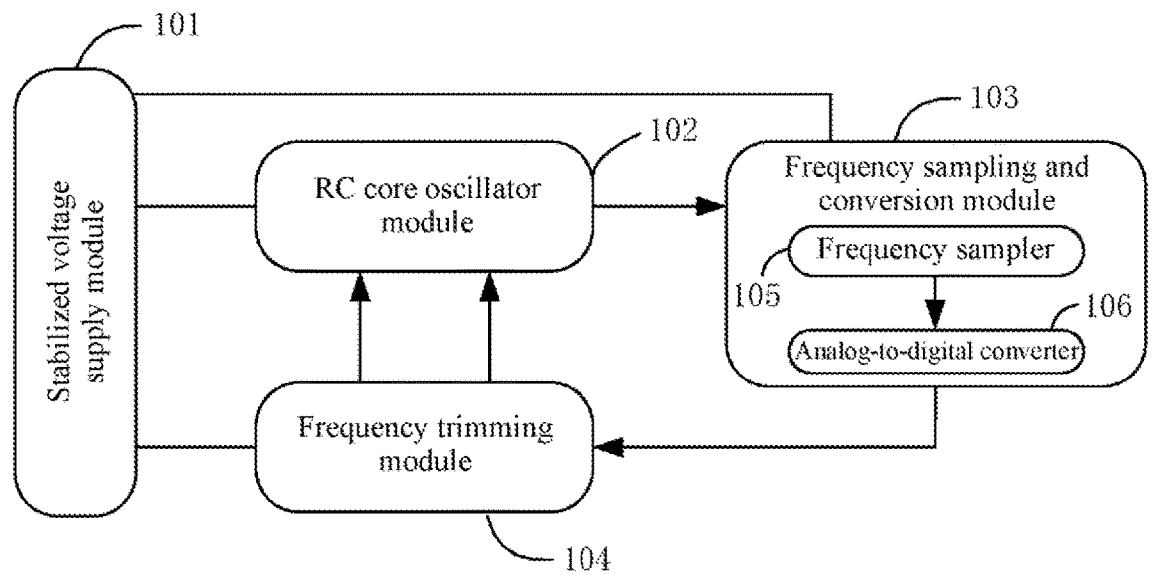
FIG. 1 is a circuit principle block diagram of an on-chip RC oscillator provided by an embodiment of the present disclosure.

Technical contents of the present disclosure are further described in detail below with reference to the accompanying drawings and specific embodiments.

It is necessary to ensure that the frequency of a clock signal outputted by an on-chip RC oscillator as a module widely used in a high-performance integrated circuit chip can be free of the influence of the process and source voltage, and meanwhile the on-chip RC oscillator can also output an accurate frequency in a strict temperature change range to provide the whole system with high quality and reliable clock signals. As in FIG. 1, the embodiment of the present disclosure provides an on-chip RC oscillator, which includes a stabilized voltage supply module 101, an RC core oscillator module 102, a frequency sampling and conversion module 103, and a frequency trimming module 104. The stabilized voltage supply module 101 is respectively connected to the RC core oscillator module 102, the frequency sampling and conversion module 103, and the frequency trimming module 104. The output end of the RC core oscillator module 102 is connected to the input end of the frequency sampling and conversion module 103. The output end of the frequency sampling and conversion module 103 is connected to the input end of the frequency trimming module 104. The output end of the frequency trimming module 104 is connected to the RC core oscillator module 102.

The stabilized voltage supply module 101 is configured to generate one or more supply voltages that do not change with source voltages and supply power to other modules of this on-chip RC oscillator.

The frequency sampling and conversion module 103 is configured to convert the real-time sampled frequency of a clock signal outputted by the RC core oscillator module 102 into a voltage signal, and perform analog-to-digital conversion to obtain a corresponding digital code.

The frequency trimming module 104 is configured to receive the digital code outputted by the frequency sampling and conversion module 103, and generate a control signal through the digital code according to a preset voltage with a standard temperature coefficient and current with a zero temperature coefficient of the on-chip RC oscillator for controlling the output of a voltage with an appropriate temperature coefficient and the current with the zero temperature coefficient to the RC core oscillator module, so as to realize temperature compensation and accuracy calibration of the clock frequency outputted by the RC core oscillator module.

The stabilized voltage supply module 101 is configured to isolate an external source voltage and generate an internal supply voltage that does not change with the source voltage. A voltage outputted by the stabilized voltage supply module 101 is used for supplying power to the RC core oscillator module 102, so that non-ideal factors such as external power source disturbances and noise interference can be eliminated, and thus, the influence of external power source fluctuation on the frequency of the clock signal outputted by the on-chip RC oscillator is effectively avoided. The stabilized voltage supply module 101 may be realized by any voltage stabilizing circuit, which may be a linear stabilized voltage power source or a switching power source circuit.

Figure 2:
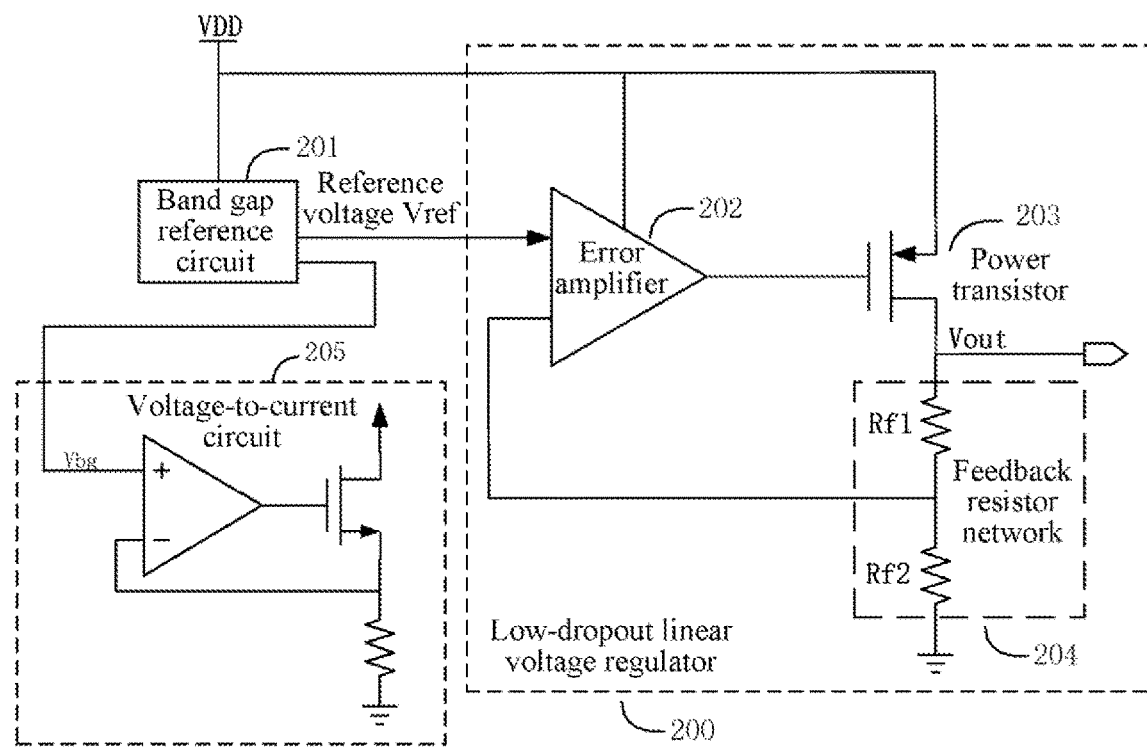
FIG. 2 is a circuit principle diagram of a stabilized voltage supply module in the on-chip RC oscillator provided by an embodiment of the present disclosure.

In one embodiment of the present disclosure, as shown in FIG. 2, the linear stabilized voltage power source adopted by the stabilized voltage supply module 101 may include a first band gap reference circuit 201, a voltage-to-current circuit 205, and a first low-dropout linear voltage regulator 200. The first low-dropout linear voltage regulator 200 includes an error amplifier 202, a power transistor 203 and a feedback resistor network 204. The output end of the first band gap reference circuit 201 is connected to the non-inverting input end of the error amplifier 202 and the input end of the voltage-to-current circuit 205. The inverting input end of the error amplifier 202 is connected to the feedback resistor network 204. The output end of the error amplifier 202 is connected to a gate electrode of the power transistor 203. A drain electrode of the power transistor 203 and the feedback resistor network 203 are connected together to form the output end of the first low-dropout linear voltage regulator 200, which is used for connection to an output load. A source voltage VDD is respectively connected to the first band gap reference circuit 201, the error amplifier 202 and the power transistor 203. The feedback resistor network 204 is grounded. The feedback resistor network 204 is composed of a resistor Rf1 and a resistor Rf2 connected in series. The voltage-to-current circuit 205 is composed of an operational amplifier, a power transistor and a resistor, and a current outputted by the voltage-to-current circuit provides a DC bias current for other modules. The voltage-to-current circuit 205 is an existing mature circuit, and the specific structure and working principle of the voltage-to-current circuit are not described here.

The function of the first band gap reference circuit 201 is to generate a reference voltage Vref and a bias current, and the reference voltage Vref is provided to the error amplifier 202 as an input reference voltage. The error amplifier 202, the power transistor 203 and the feedback resistor network 204 form a negative feedback loop to realize voltage clamping, so that the first low-dropout linear voltage regulator 200 generates an internal power supply voltage that does not change with the source voltage. The voltage-to-current circuit 205 is configured to provide currents with zero temperature coefficients for the frequency sampling and conversion module 103 and the frequency trimming module 104 respectively, so as to reduce the influence of temperature on the clock frequency outputted by the RC core oscillator module 102.

The RC core oscillator module 102 is configured to generate a clock frequency controlled by a voltage or a current. The implementation mode of the RC core oscillator module 102 is various. The RC core oscillator module 102 may be of a voltage controlled oscillator structure or a current controlled oscillator structure. The RC core oscillator module 102 may also be a feedback self-excited oscillation circuit composed of a resistor, a capacitor and an amplifier. The RC core oscillator module 102 may also be a ring oscillator composed of inverters.

Figure 3:
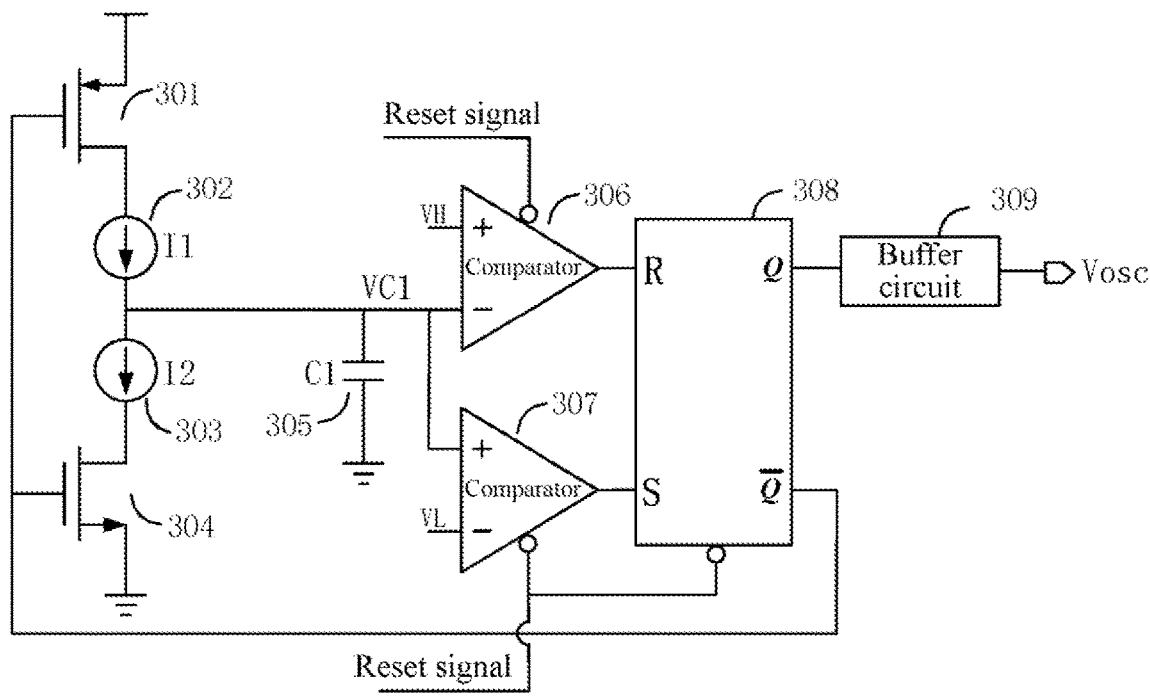
FIG. 3 is a circuit principle diagram of an RC core oscillator module in the on-chip RC oscillator provided by an embodiment of the present disclosure.

The following description takes the RC core oscillator module 102 generating a clock frequency controlled by a current as an example. As shown in FIG. 3, the RC core oscillator module 102 includes a first switch transistor 301, a second switch transistor 304, a first capacitor C1, a first comparator 306, a second comparator 307, an RS trigger 308, and a buffer circuit 309. Gate electrodes of the first switch transistor 301 and the second switch transistor 304 are respectively connected to the output end $\overline{Q}$ of the RS trigger 308, and drain electrodes of the first switch transistor 301 and the second switch transistor 304 are respectively connected to one end of a first bias current I1_302 and one end of a second bias current I2_303. The other ends of the first bias current I1_302 and the second bias current I2_303 are connected to one end of the first capacitor C1, the inverting input end of the first comparator 306 and the non-inverting input end of the second comparator 307. The non-inverting input end of the first comparator 306 and the inverting input end of the second comparator 307 are connected to the corresponding voltage output ends of the frequency trimming module 104 (such as the voltage output ends VH and VL of a second low-dropout linear voltage regulator 605 of the frequency trimming module 104 shown in FIG. 6). The output ends of the first comparator 306 and the second comparator 307 are connected to the corresponding input ends R and S of the RS trigger 308, and the signal output end Q of the RS trigger 308 is connected to the input end of the buffer circuit 309. The first comparator 306, the second comparator 307 and the RS trigger 308 respectively receive reset signals. A source electrode of the first switch transistor 301 is connected to the source voltage, and a source electrode of the second switch transistor 304 and the other end of the first capacitor C1 are respectively grounded. The first switch transistor 301 may be realized by a PMOS transistor, and the second switch transistor 304 may be realized by a NMOS transistor.

The process of generating a current-controlled clock frequency by the RC core oscillator module 102 is as follows: firstly, a first initial bias current I1 and a second initial bias current I2 provided by the first band gap reference circuit 201 of the stabilized voltage supply module 101 are received; the first bias current I1_302 and the second bias current I2_303 are controlled respectively by the first switch transistor 301 and the second switch transistor 304 to charge and discharge the first capacitor C1; a voltage VC1 generated on the first capacitor C1 passes through the first comparator 306 and the second comparator 307 respectively, and is compared with the corresponding first reference voltage VH and second reference voltage VL, and high and low levels are alternatively and continuously outputted to the RC trigger 308, so that the RS trigger 308 outputs logic high and low levels of 0 or 1 to control the first switch transistor 301 and the second switch transistor 304 to be alternately in the on-off state, and thus, the first bias current I1_302 and the second bias current I2_303 are controlled to continuously charge and discharge the first capacitor C1; and a generated voltage VC1 is compared with the corresponding reference voltages respectively by the first comparator 306 and the second comparator 307, and so on, a clock signal is obtained. The buffer circuit 309 drives and shapes the clock signal, so that the RC core oscillator module 102 may output a clock signal with a certain frequency. The reset signals control the enabling of the first comparator 306, the second comparator 307 and the RS trigger.

Specifically, when the first switch transistor 301 is in the on state, the second switch transistor 304 is in the off state, at this time, the first capacitor C1 is charged by the first bias current I1_302, a voltage VC1 at a capacitor end is outputted to the first comparator 306 and the second comparator 307 respectively, and if the voltage VC1 is greater than or less than the first reference voltage VH, a voltage outputted by the first comparator 306 jumps correspondingly. Similarly, when the second switch transistor 304 is in the on state, the first switch transistor 302 is in the off state, at this time, the first capacitor C1 is discharged, the voltage VC1 at the capacitor end is outputted to the first comparator 306 and the second comparator 307 respectively, if the voltage VC1 is greater than or less than the second reference voltage VL, a voltage outputted by the second comparator 307 jumps correspondingly, so that the voltages outputted by the first comparator 306 and the second comparator 307 change alternately between high and low levels, and thus, a clock signal is generated.

As the cycle of the clock signal generated by the RC core oscillator module 102 is the charging and discharging time of the first capacitor C1, the charging and discharging time of the first capacitor C1 is determined by the impedance of the first switch transistor 301 and the second switch transistor 304, the first bias current I1_302, the second bias current I2_303 and the first capacitance value of the first capacitor C1. However, the impedance of the first switch transistor 301 and the second switch transistor 304 and the first capacitance value of the first capacitor C1 are fixed values, and therefore, by adjusting the first bias current I1_302 and the second bias current I2_303, the accuracy of the frequency of the clock signal outputted by the RC core oscillator module may be calibrated.

As the temperature coefficients corresponding to the first reference voltage VH and the second reference voltage VL determine the temperature characteristics of the frequency of the clock signal outputted by the RC core oscillator module, the temperature compensation of the frequency of the clock signal outputted by the RC core oscillator module 102 may be realized by adjusting the temperature coefficients corresponding to the first reference voltage VH and the second reference voltage VL.

It should be noted that if the voltage stabilizing circuit adopted by the stabilized voltage supply module 101 cannot provide the first bias current I1_302 and the second bias current I2_303 to the RC core oscillator module 102, a self-bias current generation circuit may be added to the stabilized voltage supply module 101 at this time, so as to provide the first bias current I1 and the second bias current I2 for the RC core oscillator module 102.

As shown in FIG. 1, the frequency sampling and conversion module 103 includes a frequency sampling module 105 and an analog-to-digital conversion module 106. The input end of the frequency sampling module 105 is connected to the output end of the RC core oscillator module 102. The output end of the frequency sampling module 105 is connected to the input end of the analog-to-digital conversion module 106. The output end of the analog-to-digital conversion module 106 is connected to the input end of the frequency trimming module 104.

Figure 4:
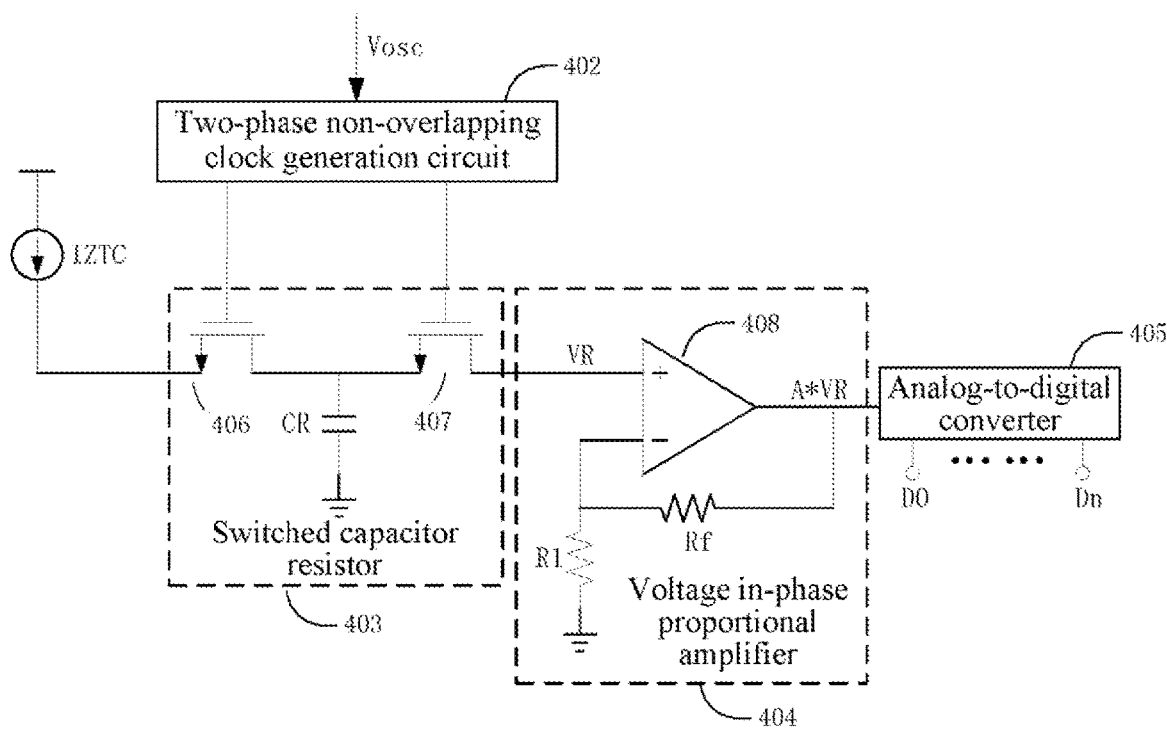
FIG. 4 is a circuit principle diagram of a frequency sampling and conversion module in the on-chip RC oscillator provided by an embodiment of the present disclosure.

The frequency sampling module 105 is configured to sample the frequency of the clock signal outputted by the RC core oscillator module 102 in real time and convert the sampled frequency into a voltage signal. As shown in FIG. 4, the frequency sampling module 105 includes a two-phase non-overlapping clock generation circuit 402, a switched capacitor resistor 403 and a voltage in-phase proportional amplifier 404. The input end of the two-phase non-overlapping clock generation circuit 402 is connected to the output end of the RC core oscillator module 102. The output end of the two-phase non-overlapping clock generation circuit 402 is connected to the switched capacitor resistor 403. The switched capacitor resistor 403 is respectively connected to a zero-temperature current source IZTC and the input end of the voltage in-phase proportional amplifier 404. The output end of the voltage in-phase proportional amplifier 404 is connected to the analog-to-digital conversion module 405.

Specifically, as shown in FIG. 4, the switched capacitor resistor 403 includes a first NMOS transistor 406, a second NMOS transistor 407 and a second capacitor CR. Gate electrodes of the first NMOS transistor 406 and the second NMOS transistor 407 are respectively connected to the output end of the two-phase non-overlapping clock generation circuit 402. A source electrode of the first NMOS transistor 406 is connected to the zero-temperature current source IZTC. The zero-temperature current source IZTC makes the sampled clock signal frequency of the RC core oscillator module 102 less affected by temperature to ensure the accuracy of frequency sampling. A drain electrode of the first NMOS transistor 406 and a source electrode of the second NMOS transistor 407 are respectively connected to one end of the second capacitor CR; the other end of the second capacitor CR is grounded; and a drain electrode of the second NMOS transistor 407 is connected to the input end of the voltage in-phase proportional amplifier 404.

As shown in FIG. 4, the voltage in-phase proportional amplifier 404 includes a first operational amplifier 408, a first resistor Rf and a second resistor R1. The non-inverting input end of the first operational amplifier 408 is connected to the drain electrode of the second NMOS transistor 407 of the switched capacitor resistor 403. The inverting input end of the first operational amplifier 408 is respectively connected to one end of the first resistor Rf and one end of the second resistor R1. The other end of the first resistor Rf is grounded. The other end of the second resistor R1 is respectively connected to the output end of the first operational amplifier 408 and the analog-to-digital conversion module 405.

The process of converting the real-time sampled frequency of the clock signal outputted by the RC core oscillator module 102 into a voltage signal by the frequency sampling module 105 is as follows: a clock signal Vosc outputted by the RC core oscillator module 102 generates continuous high and low levels through the two-phase non-overlapping clock generation circuit 402, which are used for controlling the on-off of the first NMOS transistor 406 and the second NMOS transistor 407, and thus, the charging and discharging of the second capacitor CR is realized so as to generate the equivalent resistance value R of the sampled clock signal. Assuming that the oscillation period of the clock signal Vosc outputted by the RC core oscillator module 102 is T, the equivalent resistance value of the clock signal is $$R = \frac{T}{CR},$$

the corresponding voltage is $$VR = IZTC * R = IZTC * \frac{T}{CR},$$

where CR is the capacitance value of the second capacitor CR, and IZTC is a current with a zero temperature coefficient. In this way, the frequency of the clock signal outputted by the RC core oscillator module 102 is converted into the voltage VR. In consideration of the variation amplitude of the voltage VR and the accuracy of the analog-to-digital conversion module 405, the voltage VR is amplified by the voltage in-phase proportional amplifier 404, and the magnification times is $$A = 1 + \frac{Rf}{R1}.$$

The analog-to-digital conversion module may be realized by using an existing analog-to-digital conversion chip. The analog-to-digital conversion chip is configured to convert an amplified voltage VR outputted by the frequency sampling module 105 into digital codes D0, . . . , Dn (composed of high and low levels of 0 and 1). The conversion digits and conversion accuracy of the analog-to-digital conversion chip determine the accuracy of temperature compensation and calibration of the frequency of the clock signal outputted by the RC core oscillator module by the frequency trimming module 104, and therefore, an appropriate analog-to-digital conversion chip can be selected according to the required temperature characteristics and frequency accuracy of the clock signal.

Figure 5:
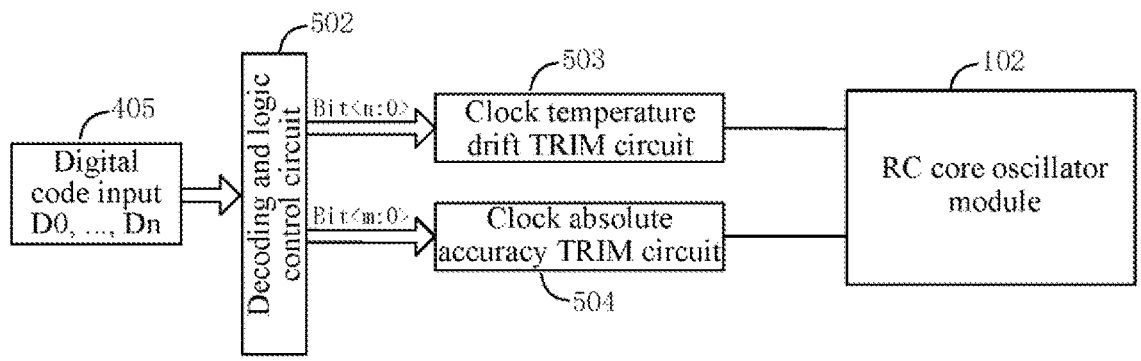
FIG. 5 is a circuit principle diagram of a frequency trimming module in the on-chip RC oscillator provided by an embodiment of the present disclosure.

As shown in FIG. 5, the frequency trimming module 104 includes a decoding and logic control circuit 502, a clock temperature drift trimming circuit 503, and a clock absolute accuracy trimming circuit 504. The input end of the decoding and logic control circuit 502 is connected to the output end of the analog-to-digital conversion module 405. The output end of the decoding and logic control circuit 502 is connected to the input ends of the clock temperature drift trimming circuit 503 and the clock absolute accuracy trimming circuit 504. The clock temperature drift trimming circuit 503 is connected to the non-inverting input end of the first comparator 306 and the inverting input end of the second comparator 307 of the RC core oscillator module 102. The output end of the clock absolute accuracy trimming circuit 504 is connected to the first bias current I1_302 and the second bias current I2_303 of the RC core oscillator module 102.

The digital code outputted by the analog-to-digital conversion module 405 is converted into digital control signals Bit<n:0> and Bit<m:0> of high and low levels by the decoding and logic control circuit 502, where m and n represent digits. The control signal Bit<n:0> is used for controlling the clock temperature drift trimming circuit 503 to provide the RC core oscillator module 102 with the first reference voltage VH and the second reference voltage VL corresponding to required temperature coefficients according to the preset voltage with the standard temperature coefficient of the on-chip RC oscillator, thereby realizing the trimming of the temperature characteristics of the frequency of the clock signal outputted by the RC core oscillator module 102.

The control signal Bit<m:0> is used for controlling the clock absolute accuracy trimming circuit 504 to provide the RC core oscillator module 102 with a first zero temperature coefficient current I3 and a second zero temperature coefficient current I4 according to the preset standard current with the zero temperature coefficient of the on-chip RC oscillator, thereby realizing the trimming of the absolute accuracy of the frequency of the clock signal outputted by the RC core oscillator module 102.

Figure 6:
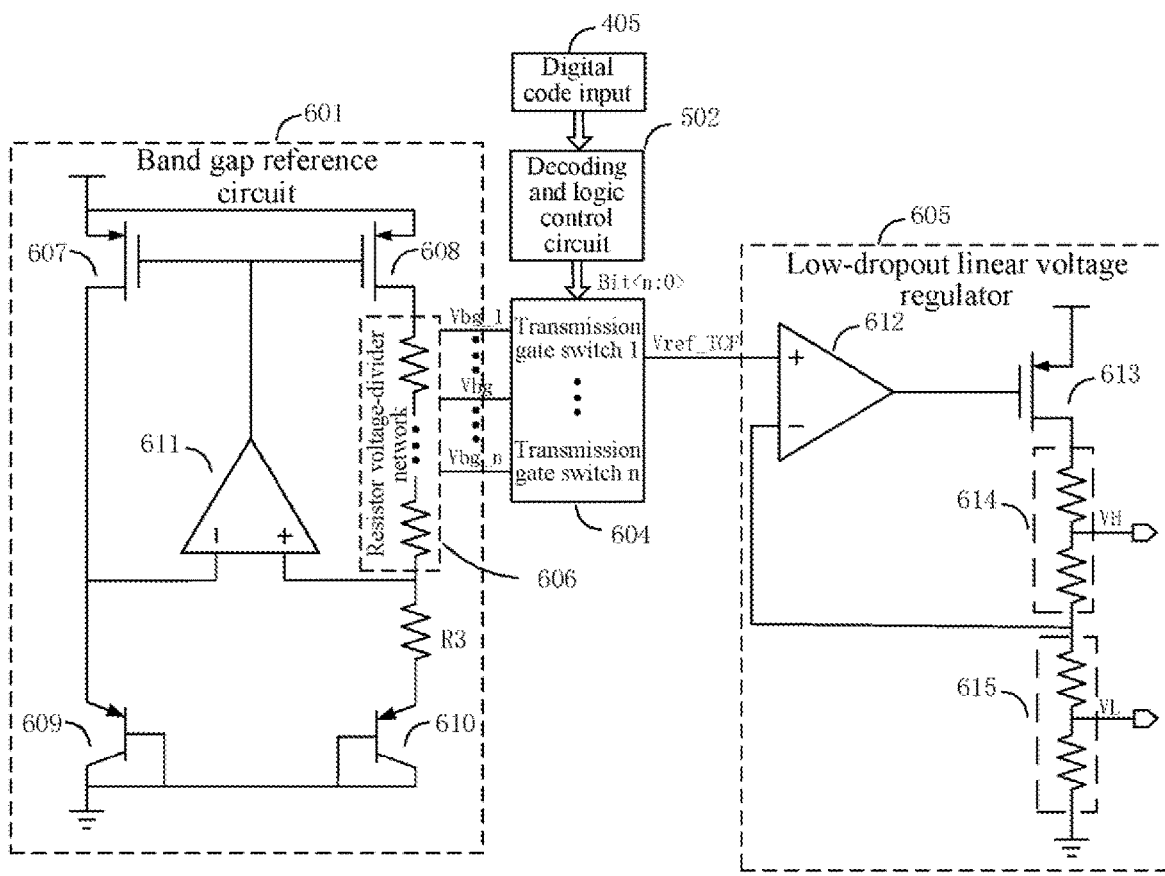
FIG. 6 is a principle diagram of a clock temperature drift trimming circuit in the on-chip RC oscillator provided by an embodiment of the present disclosure.

As shown in FIG. 6, the clock temperature drift trimming circuit 503 includes a second band gap reference circuit 601, a first transmission gate switch group 604 and a second low-dropout linear voltage regulator 605. The second band gap reference circuit 601 is connected to the first transmission gate switch group 604. The first transmission gate switch group 604 is respectively connected to the output end of the decoding and logic control circuit 502 and the input end of the second low-dropout linear voltage regulator 605. The output end of the second low-dropout linear voltage regulator 605 is correspondingly connected to the non-inverting input end of the first comparator 306 and the inverting input end of the second comparator 307 of the RC core oscillator module 102.

As shown in FIG. 6, the second band gap reference circuit 601 includes a first PMOS transistor 607, a second PMOS transistor 608, a first triode 609, a second triode 610, a second operational amplifier 611, and a first resistor voltage-divider network 606. A drain electrode of the first PMOS transistor 607 and an emitting electrode of the first triode 609 are respectively connected to the inverting input end of the second operational amplifier 611. The non-inverting input end of the second operational amplifier 611 is connected to one end of the first resistor voltage-divider network 606 on the one hand, and an emitting electrode of the second triode 610 through the third resistor R3 on the other hand. The other end of the first resistor voltage-divider network 606 is connected to a drain electrode of the second PMOS transistor 608. The output end of the second operational amplifier 611 is connected to gate electrodes of the first PMOS transistor 607 and the second PMOS transistor 608. The first resistor voltage-divider network 606 is connected to the first transmission gate switch group 604. Source electrodes of the first PMOS transistor 607 and the second PMOS transistor 608 are respectively connected to the source voltage. Base electrodes and collector electrodes of the first triode 609 and the second triode 610 are respectively grounded.

It should be noted that the first PMOS transistor 607, the second PMOS transistor 608, the first triode 609, the second triode 610 and the second operational amplifier 611 form the basic structure of the typical first band gap reference circuit 201. Therefore, the second band gap reference circuit 601 may be formed by connecting the first band gap reference circuit 201 to the first resistor voltage-divider network 606.

As shown in FIG. 6, the first resistor voltage-divider network 606 may be formed by connecting a plurality of fourth resistors in series, and is configured to generate voltages Vbg1, . . . , Vbgn with different values and different temperature coefficients. The first transmission gate switch group 604 includes a plurality of first transmission gate switches. The number of first transmission gate switches is the same as the number of voltages Vbg with different values and different temperature coefficients generated by the first resistor voltage-divider network 606, and the first transmission gate switches correspond to the voltages Vbg one by one.

The two ends of each fourth resistor are respectively and correspondingly connected to one first transmission gate switch, that is, each voltage with a fixed value and a fixed temperature coefficient outputted by the first resistor voltage-divider network 606 corresponds to one first transmission gate switch. When the sampled frequency of the clock signal outputted by the RC core oscillator module 102 changes due to temperature, environment and other factors, the digital code corresponding to the frequency of the clock signal changes accordingly. According to the preset voltage with the standard temperature coefficient of the on-chip RC oscillator, the corresponding first transmission gate switch is controlled to output a voltage Vref_TCF with an appropriate temperature coefficient to the second low-dropout linear voltage regulator 605 through the digital control signal Bit<n:0> of high and low levels converted by the digital code through the decoding and logic control circuit 502. The voltage Vref_TCF serves as the reference voltage of the second low-dropout linear voltage regulator 605, and is used for making the second low-dropout linear voltage regulator 605 output the first reference voltage VH and the second reference voltage VL with appropriate temperature coefficients to the RC core oscillator module 102, so as to realize the trimming of the temperature characteristics of the clock signal outputted by the RC core oscillator module 102 by trimming the first reference voltage VH and the second reference voltage VL.

As shown in FIG. 6, the second low-dropout linear voltage regulator 605 includes an error amplifier 612, a power transistor 613, a second resistor voltage-divider network 614 and a third resistor voltage-divider network 615. The non-inverting input end of the error amplifier 612 is connected to the first transmission gate switch group 604, and the inverting input end of the error amplifier 612 is connected to one end of the second resistor voltage-divider network 614 and one end of the third resistor voltage-divider network 615. The other end of the second resistor voltage-divider network 614 is connected to a drain electrode of the power transistor 613. The other end of the third resistor voltage-divider network 615 is grounded. The output end of the error amplifier 612 is connected to a gate electrode of the power transistor 613. A source electrode of the power transistor 613 is connected to the source voltage. The error amplifier 612, and the power transistor 613 form a negative feedback loop respectively with the second resistor voltage-divider network 614 and the third resistor voltage-divider network 615 to realize voltage clamping, so that the second low-dropout linear voltage regulator 605 outputs the first reference voltage VH and the second reference voltage VL with the appropriate temperature coefficients to the RC core oscillator module 102, so as to trim the temperature characteristics of the clock signal outputted by the RC core oscillator module 102, and further realize the closed-loop real-time compensation for the temperature change of the frequency of the clock signal outputted by the RC core oscillator module 102, and therefore, the frequency of the clock signal outputted by the RC oscillator is almost constant with the temperature. The second resistor voltage-divider network 614 and the third resistor voltage-divider network 615 are formed respectively by connecting resistors in series. The number of resistors in the second resistor voltage-divider network 614 and the third resistor voltage-divider network 615 depends on the actually required temperature coefficients of the first reference voltage VH and the second reference voltage VL.

Figure 7:
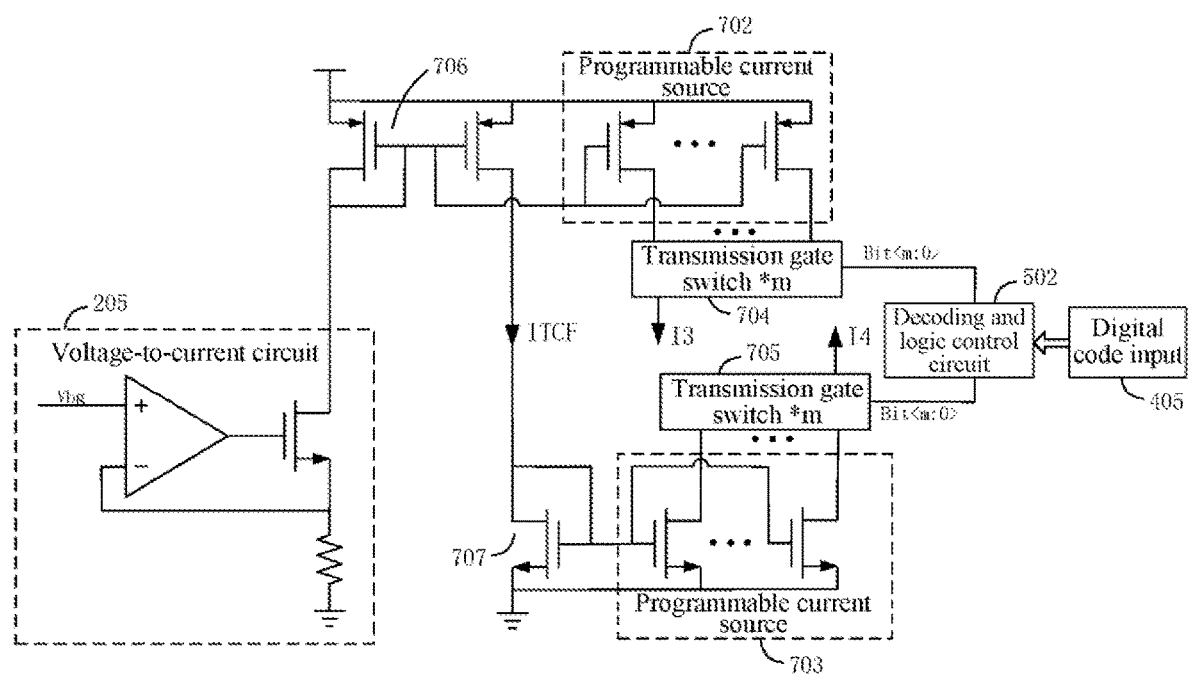
FIG. 7 is a principle diagram of a clock absolute accuracy trimming circuit in the on-chip RC oscillator provided by an embodiment of the present disclosure.

As shown in FIG. 7, the clock absolute accuracy trimming circuit 504 includes a first programmable current source 702, a second programmable current source 703, a second transmission gate switch group 704, and a third transmission gate switch group 705. The first programmable current source 702 and the second programmable current source 703 are correspondingly connected to the output end of the voltage-to-current circuit 205 through a first current mirroring circuit 706 and a second current mirroring circuit 707, and are configured to respectively receive the current ITCF with the zero temperature coefficient outputted by the voltage-to-current circuit 205. The first programmable current source 702 is connected to the second transmission gate switch group 704. The second programmable current source 703 is connected to the third transmission gate switch group 705. The second transmission gate switch group 704 and the third transmission gate switch group 705 are respectively connected to the output end of the decoding and logic control circuit 502.

As shown in FIG. 7, the first programmable current source 702 is composed of a plurality of third PMOS transistors, and is configured to generate different first currents I3 with zero temperature coefficients. The second transmission gate switch group 704 includes a plurality of second transmission gate switches. A gate electrode of each third PMOS transistor is respectively connected to the output end of the voltage-to-current circuit 205 through the first current mirroring circuit 706, and a drain electrode of each third PMOS transistor is respectively connected to a second transmission gate switch, that is, each first current I3 with the zero temperature coefficient outputted by the first programmable current source 702 corresponds to a second transmission gate switch.

As shown in FIG. 7, the second programmable current source 703 is composed of a plurality of third NMOS transistors, and is configured to generate different second currents I4 with zero temperature coefficients. The third transmission gate switch group 705 includes a plurality of third transmission gate switches. A gate electrode of each third NMOS transistor is respectively connected to the output end of the voltage-to-current circuit 205 through the second current mirroring circuit 707, and a drain electrode of each third NMOS transistor is respectively connected to a third transmission gate switch, that is, each second current I4 with the zero temperature coefficient outputted by the second programmable current source 703 corresponds to a third transmission gate switch. The number of the second transmission gate switches, the number of the third transmission gate switches, the number of the first currents I3 with the zero temperature coefficients generated by the first programmable current source 702, and the number of the second currents I4 with the zero temperature coefficients generated by the second programmable current source 703 are the same, and the second transmission gate switches, the third transmission gate switches, the first currents and the second currents correspond to each other one by one.

When the sampled frequency of the clock signal outputted by the RC core oscillator module 102 changes, the digital code corresponding to the frequency of the clock signal changes accordingly. According to the preset first currents I3 with the zero temperature coefficients and second currents I4 with the zero temperature coefficients of the on-chip RC oscillator, the corresponding second transmission gate switch and third transmission gate switch are controlled through the digital control signal Bit<m:0> of high and low levels converted by the digital code through the decoding and logic control circuit 502 to provide the RC core oscillator module 102 with the first currents I3 with the zero temperature coefficients and the second currents I4 with the zero temperature coefficients of suitable magnitude as charging and discharging currents in the RC core oscillator module, thereby trimming the absolute accuracy of the frequency of the clock signal outputted by the RC core oscillator module 102 by adjusting the absolute values of the first currents I3 with the zero temperature coefficient and the second currents I4 with the zero temperature coefficients, and further realizing the calibration of the absolute accuracy of the frequency of the clock signal outputted by the RC oscillator.

In addition, the on-chip RC oscillator provided in the embodiment of the present disclosure can be used in the integrated circuit chip. The specific structure of the on-chip RC oscillator in the integrated circuit chip is not described in detail here.

The above-mentioned on-chip RC oscillator may also be used in communication terminals as an important part of analog integrated circuits. The communication terminal mentioned herein means a computer device supporting a variety of communication systems (such as GSM, EDGE, TD_SCDMA, TDD_LTE and FDD_LTE) which can be used in mobile environment, including a mobile phone, a laptop, a tablet personal computer and an on-board computer. Moreover, the technical solution provided by the present disclosure is also applicable to the application occasions of other analog integrated circuits, such as communication base stations.

According to the on-chip RC oscillator, the chip and the communication terminal provided by the embodiments of the present disclosure, by means of the frequency sampling and conversion module, the clock frequency of the oscillator is sampled and detected in real time, and the sampled clock frequency is converted into a voltage, and then analog-to-digital conversion is performed to obtain a corresponding digital code, so that when the clock frequency changes, the frequency trimming module circuit converts the digital code into a control signal; a voltage having a suitable temperature coefficient is outputted for the RC core oscillator module, so as to achieve temperature compensation of the clock frequency; also, a zero temperature coefficient current of a suitable magnitude is outputted for the RC core oscillator module, so as to calibrate the accuracy of the clock frequency. Therefore, by performing closed-loop real-time calibration compensation on the temperature change of the clock frequency of the oscillator, the frequency of the clock signal outputted by the oscillator can be almost constant with temperature. At the same time, the high-accuracy on-chip RC oscillator may be realized by using an accuracy trimming technology to calibrate the clock frequency accuracy.

The on-chip RC oscillator, the chip and the communication terminal provided by the embodiments of the present disclosure have been described in detail above. For a person of ordinary skill in the art, any obvious modifications made to the present disclosure without departing from the essential contents will fall within the protection scope of the patent right of the present disclosure.

What is claimed is:

1. An on-chip RC oscillator, comprising a stabilized voltage supply module, an RC core oscillator module, a frequency sampling and conversion module, and a frequency trimming module, the stabilized voltage supply module being respectively connected to the RC core oscillator module, the frequency sampling and conversion module, and the frequency trimming module, the output end of the RC core oscillator module being connected to the input end of the frequency sampling and conversion module, the output end of the frequency sampling and conversion module being connected to the input end of the frequency trimming module, and the output end of the frequency trimming module being connected to the RC core oscillator module, wherein the stabilized voltage supply module is configured to generate a supply voltage that does not change with a source voltage;

the frequency sampling and conversion module is configured to convert the real-time sampled frequency of a clock signal outputted by the RC core oscillator module into a voltage signal, and then perform analog-to-digital conversion to obtain a corresponding digital code; and the frequency trimming module is configured to receive the digital code, and generate a control signal through the digital code according to a preset voltage with a standard temperature coefficient and current with a zero temperature coefficient of the on-chip RC oscillator for controlling the output of a voltage with an appropriate temperature coefficient and the current with the zero temperature coefficient to the RC core oscillator module, so as to realize temperature compensation and accuracy calibration of the frequency of a clock signal outputted by the RC core oscillator module.

2. The on-chip RC oscillator according to claim 1, wherein the RC core oscillator module comprises a first switch transistor, a second switch transistor, a first capacitor, a first comparator, a second comparator, an RS trigger and a buffer circuit; gate electrodes of the first switch transistor and the second switch transistor are respectively connected to the output end of the RS trigger; drain electrodes of the first switch transistor and the second switch transistor are respectively connected to one end of a first bias current and one end of a second bias current; the other end of the first bias current and the other end of the second bias current are connected to one end of the first capacitor, the inverting input end of the first comparator and the non-inverting input end of the second comparator; the non-inverting input end of the first comparator and the inverting input end of the second comparator are connected to the corresponding voltage output end of the frequency trimming module; the output ends of the first comparator and the second comparator are connected to the corresponding input end of the RS trigger; the signal output end of the RS trigger is connected to the input end of the buffer circuit; the first comparator, the second comparator and the RS trigger respectively receive reset signals; a source electrode of the first switch transistor is connected to the source voltage; and a source electrode of the second switch transistor and the other end of the first capacitor are respectively grounded.

3. The on-chip RC oscillator according to claim 1, wherein the frequency sampling and conversion module comprises a frequency sampling module and an analog-to-digital conversion module; the input end of the frequency sampling module is connected to the output end of the RC core oscillator module; the output end of the frequency sampling module is connected to the input end of the analog-to-digital conversion module; and the output end of the analog-to-digital conversion module is connected to the input end of the frequency trimming module.

4. The on-chip RC oscillator according to claim 3, wherein the frequency sampling module comprises a two-phase non-overlapping clock generation circuit, a switched capacitor resistor and a voltage in-phase proportional amplifier; the input end of the two-phase non-overlapping clock generation circuit is connected to the output end of the RC core oscillator module; the output end of the two-phase non-overlapping clock generation circuit is connected to the switched capacitor resistor; the switched capacitor resistor is respectively connected to a zero-temperature current source and the input end of the voltage in-phase proportional amplifier; and the output end of the voltage in-phase proportional amplifier is connected to the analog-to-digital conversion module.

5. The on-chip RC oscillator according to claim 4, wherein the switched capacitor resistor comprises a first NMOS transistor, a second NMOS transistor and a second capacitor; gate electrodes of the first NMOS transistor and the second NMOS transistor are respectively connected to the output end of the two-phase non-overlapping clock generation circuit; a source electrode of the first NMOS transistor is connected to the zero-temperature current source; a drain electrode of the first NMOS transistor and a source electrode of the second NMOS transistor are respectively connected to one end of the second capacitor; the other end of the second capacitor is grounded; and a drain electrode of the second NMOS transistor is connected to the input end of the voltage in-phase proportional amplifier.

6. The on-chip RC oscillator according to claim 5, wherein the voltage in-phase proportional amplifier comprises a first operational amplifier, a first resistor and a second resistor; the non-inverting input end of the first operational amplifier is connected to the drain electrode of the second NMOS transistor; the inverting input end of the first operational amplifier is connected to one end of the first resistor and one end of the second resistor; the other end of the first resistor is grounded; and the other end of the second resistor is respectively connected to the output end of the first operational amplifier and the analog-to-digital conversion module.

7. The on-chip RC oscillator according to claim 2, wherein the frequency trimming module comprises a decoding and logic control circuit, a clock temperature drift trimming circuit and a clock absolute accuracy trimming circuit; the input end of the decoding and logic control circuit is connected to the output end of the analog-to-digital conversion module; the output end of the decoding and logic control circuit is respectively connected to the input ends of the clock temperature drift trimming circuit and the clock absolute accuracy trimming circuit; the clock temperature drift trimming circuit is connected to the non-inverting input end of the first comparator and the inverting input end of the second comparator; and the output end of the clock absolute accuracy trimming circuit is connected to the first bias current and the second bias current.

8. The on-chip RC oscillator according to claim 7, wherein the clock temperature drift trimming circuit comprises a second band gap reference circuit, a first transmission gate switch group, and a second low-dropout linear voltage regulator; the second band gap reference circuit is connected to the first transmission gate switch group; the first transmission gate switch group is respectively connected to the output end of the decoding and logic control circuit and the input end of the second low-dropout linear voltage regulator; and the output end of the second low-dropout linear voltage regulator is correspondingly connected to the non-inverting input end of the first comparator and the inverting input end of the second comparator.

9. The on-chip RC oscillator according to claim 8, wherein the second band gap reference circuit generates voltages with different values and different temperature coefficients through a first resistor voltage-divider network composed of a plurality of fourth resistors connected in series, and each voltage is correspondingly connected to one transmission gate switch in the first transmission gate switch group.

10. The on-chip RC oscillator according to claim 9, wherein the second low-dropout linear voltage regulator comprises an error amplifier, a power transistor, a second resistor voltage-divider network and a third resistor voltage-divider network; the non-inverting input end of the error amplifier is connected to the first transmission gate switch group; the inverting input end of the error amplifier is connected to one end of the second resistor voltage-divider network and one end of the third resistor voltage-divider network; the other end of the second resistor voltage-divider network is connected to a drain electrode of the power transistor; and the output end of the error amplifier is connected to a grate electrode of the power transistor.

11. The on-chip RC oscillator according to claim 7, wherein the clock absolute accuracy trimming circuit comprises a first programmable current source, a second programmable current source, a second transmission gate switch group and a third transmission gate switch group; the first programmable current source and the second programmable current source are correspondingly connected to the output end of the stabilized voltage supply module through a first current mirroring circuit and a second current mirroring circuit; the first programmable current source is connected to the second transmission gate switch group; the second programmable current source is connected to the third transmission gate switch group; and the second transmission gate switch group and the third transmission gate switch group are respectively connected to the output end of the decoding and logic control circuit.

12. The on-chip RC oscillator according to claim 11, wherein the first programmable current source is composed of a plurality of third PMOS transistors; a gate electrode of each of the third PMOS transistors is respectively connected to the output end of a voltage-to-current circuit through the first current mirroring circuit; and a drain electrode of each of the third PMOS transistors is respectively connected to a second transmission gate switch in the second transmission gate switch group; and the second programmable current source is composed of a plurality of third NMOS transistors; a gate electrode of each of the third NMOS transistors is respectively connected to the output end of the voltage-to-current circuit through the second current mirroring circuit; and a drain electrode of each of the third NMOS transistors is respectively connected to a third transmission gate switch in the third transmission gate switch group.

13. An integrated circuit chip, comprising the on-chip RC oscillator according to claim 1.

14. A communication terminal, comprising the on-chip RC oscillator according to claim 1.

* * * * *